US012782806B2

(12) United States Patent
Yoshida et al.

(10) Patent No.: US 12,782,806 B2
(45) Date of Patent: Nov. 3, 2026

(54) FILM FORMING METHOD, FILM FORMING APPARATUS, AND ARTICLE MANUFACTURING METHOD

(71) Applicant: CANON KABUSHIKI KAISHA, Tokyo (JP)

(72) Inventors: Kenji Yoshida, Tochigi (JP); Hiroyuki Koide, Tochigi (JP); Yuma Onizawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 502 days.

(21) Appl. No.: 18/329,647

(22) Filed: Jun. 6, 2023

(65) Prior Publication Data

US 2023/0400762 A1 Dec. 14, 2023

(30) Foreign Application Priority Data

Jun. 8, 2022 (JP) ................................ 2022-093095

(51) Int. Cl.
*G03F 7/00* (2006.01)
*B82Y 10/00* (2011.01)
*B82Y 40/00* (2011.01)

(52) U.S. Cl.
CPC ............ *G03F 7/0002* (2013.01); *B82Y 10/00* (2013.01); *B82Y 40/00* (2013.01)

(58) Field of Classification Search
CPC ..................................................... G03F 7/0002
See application file for complete search history.

(56) References Cited

U.S. PATENT DOCUMENTS 8,142,702 B2 3/2012 Liu et al.
2005/0067379 A1 3/2005 Sreenivasan et al.
(Continued)

FOREIGN PATENT DOCUMENTS

JP 2010530641 A 9/2010
KR 1020160100232 A 8/2016
(Continued)

OTHER PUBLICATIONS

Office Action issued in Taiwanese Appln. No. 112120814 dated Nov. 4, 2025.
(Continued)

*Primary Examiner* — James M Mellott
(74) *Attorney, Agent, or Firm* — ROSSI, KIMMS & McDOWELL LLP

(57) ABSTRACT

A film forming method includes discretely arranging, on a substrate, a plurality of droplets of a curable composition containing a polymerizable compound that is a nonvolatile component, and a solvent that is a volatile component, analyzing an image obtained by capturing a process in which each of the plurality of droplets is connected to an adjacent droplet on the substrate, thereby forming a continuous liquid film on the substrate, volatilizing the solvent contained in the liquid film by enhancing a solvent volatilization effect as compared to the process of forming the liquid film, and forming a cured film by curing the liquid film, wherein if an analysis result obtained in the analyzing satisfies a predetermined condition representing that a forming state of the liquid film is sufficient, a process advances to the volatilizing and then advances to the forming.

15 Claims, 11 Drawing Sheets

(56) References Cited

U.S. PATENT DOCUMENTS

| | | | | |
|---|---|---|---|---|
| 2005/0106321 | A1 | 5/2005 | Mcmackin et al. | |
| 2007/0228593 | A1* | 10/2007 | Jones | B82Y 10/00 425/141 |
| 2008/0308971 | A1* | 12/2008 | Liu | G03F 7/0002 264/293 |
| 2016/0236381 | A1* | 8/2016 | Takemura | B29C 43/58 |

FOREIGN PATENT DOCUMENTS

| | | | |
|---|---|---|---|
| KR | 1020200010367 | A | 1/2020 |
| KR | 1020210034519 | A | 3/2021 |
| WO | 2008156750 | A1 | 12/2008 |

OTHER PUBLICATIONS

Office Action issued in Taiwanese Appln. No. 112120814 dated Mar. 2, 2026.

* cited by examiner

FILM FORMING METHOD, FILM FORMING APPARATUS, AND ARTICLE MANUFACTURING METHOD

BACKGROUND OF THE INVENTION

Field of the Invention

The present invention relates to a film forming method, a film forming apparatus, and an article manufacturing method.

Description of the Related Art

As the need for miniaturizing semiconductor devices increases, not only a conventional photolithography technique but also a microfabrication technique for molding an uncured composition on a substrate using a mold and curing it to form a pattern of the composition on the substrate has received a great deal of attention. This technique is called an imprint technique, and can form a fine pattern on an order of several nanometers on a substrate.

One of the imprint techniques is, for example, a photo-curing method. An imprint apparatus that employs the photo-curing method molds, using a mold, a photo-curable composition supplied to a shot region on a substrate, cures the composition by light irradiation, and separates the mold from the cured composition, thereby forming a pattern on the substrate.

Japanese Patent Laid-Open No. 2010-530641 discloses an imprint method using a composition containing a solvent and a polymerizable material. This imprint method includes a step of forming a liquid film on a substrate surface by connecting compositions supplied onto the substrate, a step of evaporating a solvent from the composition, and a step of forming a cured film by polymerizing a polymerizable material in the composition.

In the method described in Japanese Patent Laid-Open No. 2010-530641, if the process advances to the step of evaporating the solvent in a state in which formation of the liquid film is insufficient, an air gap remains between the compositions, and a defect occurs in a solid layer formed on the substrate. To cope with this problem, the process waits by a predetermined time that is enough to form a liquid film without an air gap and then advances to the step of vaporizing the solvent. However, even if the formation of the liquid film is completed within the time, throughput lowers because of the wait for the predetermined time.

SUMMARY OF THE INVENTION

The present invention provides, for example, a film forming method advantageous in simultaneously suppressing defects and implementing throughput.

The present invention in its one aspect provides a film forming method including discretely arranging, on a substrate, a plurality of droplets of a curable composition containing a polymerizable compound that is a nonvolatile component, and a solvent that is a volatile component, after the arranging, analyzing an image obtained by capturing a process in which each of the plurality of droplets is connected to an adjacent droplet on the substrate, thereby forming a continuous liquid film on the substrate, volatilizing the solvent contained in the liquid film by enhancing a solvent volatilization effect as compared to the process of forming the liquid film, and forming a cured film by curing the liquid film, wherein if an analysis result obtained in the analyzing satisfies a predetermined condition representing that a forming state of the liquid film is sufficient, a process advances to the volatilizing and then advances to the forming.

Further features of the present invention will become apparent from the following description of exemplary embodiments (with reference to the attached drawings).

DESCRIPTION OF THE EMBODIMENTS

Figure 1:
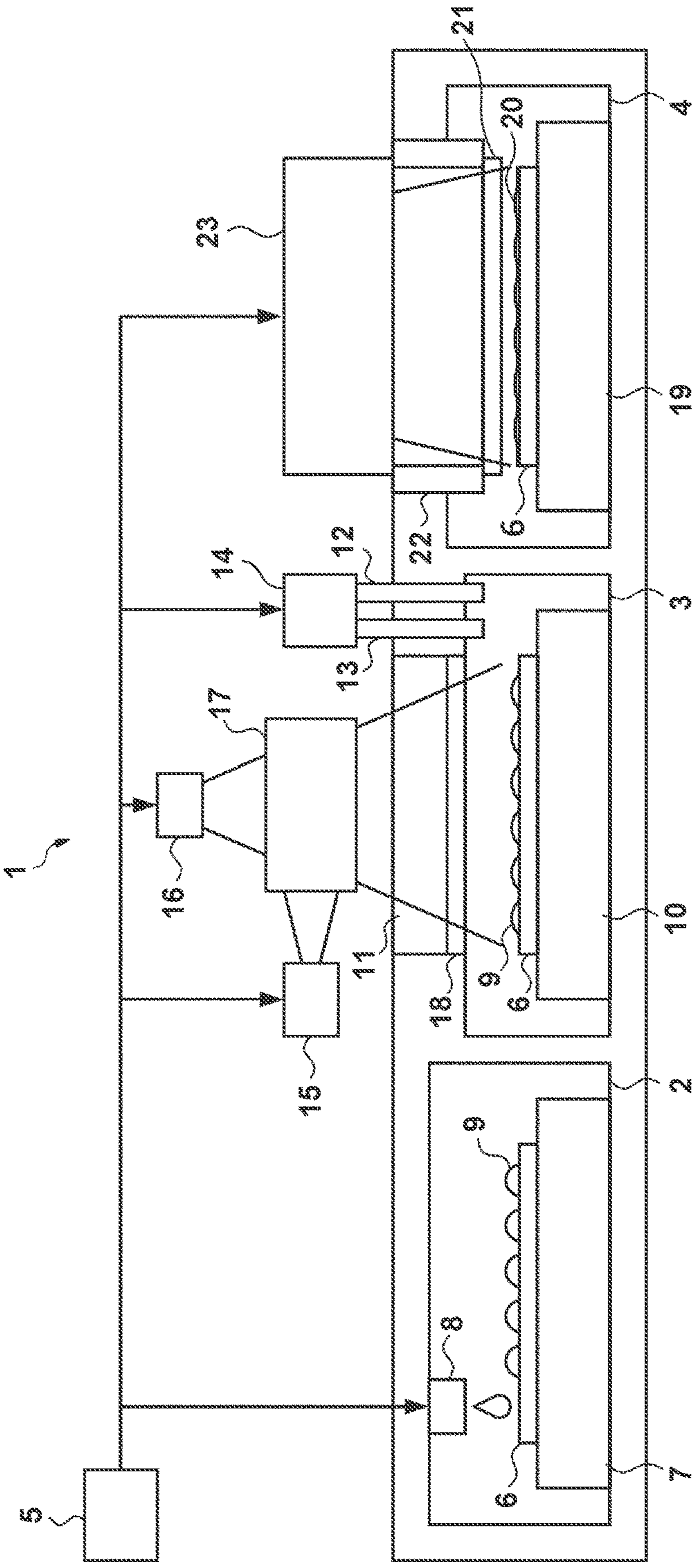
FIG. 1 is a view showing the configuration of a film forming apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

A film forming apparatus according to an embodiment will now be described. The film forming apparatus is used to manufacture a device such as a semiconductor device that is an article. The film forming apparatus arranges an uncured composition on a substrate and molds the arranged composition using a mold, thereby forming a film of the composition on the substrate. In this embodiment, the film forming apparatus can be a film forming apparatus employing a photo-curing method. Since the photo-curing method is employed, the composition is a photo-curable moldable material.

When assuming a mass production apparatus for semiconductor devices or the like, a pattern transfer method and apparatus to which imprint lithography employing the photo-curing method is applied are known. The imprint method by the photo-curing method is generally performed as follows. First, a supply mechanism (dispenser) using inkjet nozzles or the like supplies, to a shot region that is an imprint target on a wafer, a composition to be cured by ultraviolet light. Then, a mold with a device pattern drawn thereon is brought into contact with the composition. When the composition is sufficiently filled into the pattern of the mold, light (ultraviolet light (UV)) is applied to cure the composition. After that, the mold is separated from the composition. Thus, a fine pattern having good line width variations can be formed on the wafer. Hence, in an example, a film forming apparatus 1 can be an imprint apparatus that transfers the pattern of a mold as described above to a composition on a substrate.

In an EUV photolithography step, along with an increase of the NA, the depth of focus (to be referred to as "DOF" hereinafter) at which the projection image of a fine circuit pattern is formed is decreasing in recent years. In a recent example, the allowable DOF of an EUV lithography apparatus with NA=0.33 is 300 nm to 110 nm (depending on the illumination mode). The allowable DOF of an EUV lithography apparatus with NA=0.55 is 160 nm to 40 nm (depending on the illumination mode). However, it has been found that it is difficult for the method of applying a SOC film by a conventional spin coater to achieve the sufficient surface planarization performance which falls within the allowable range as described above. Particularly, in a case of spin coating, a layer having a uniform film thickness is formed on a wafer due to the viscosity of the SOC coating agent dropped onto the wafer and the centrifugal force by spinning. Therefore, if a region where a change in wiring density of the underlying pattern of the process wafer is 5 μm or more exists in a long cycle, the boarder where the wiring density changes is left intact and appears on the surface of the SOC film.

In recent years, a planarization method with the above-described imprint technique applied thereto has been examined. In this method, a superstrate as a member with no pattern formed thereon is pressed against a composition in a liquid state supplied onto a wafer, the composition is cured by UV exposure after the composition has spread, and then the superstrate is separated. Note that the term "imprint" is often used in the concept of transferring a pattern drawn on a mold by pressing the pattern, but in the planarization process, no pattern is drawn on the superstrate.

The outline of a planarization process using an imprint technique by the photo-curing method will be described with reference to FIGS. 12A to 12D. In the planarization process using the imprint technique by the photo-curing method, a substrate (wafer) can be planarized by a supply step shown in FIG. 12A, a contact step shown in FIG. 12B, a curing step shown in FIG. 12C, and a separation step shown in FIG. 12D. In FIGS. 12A to 12D, a circuit pattern is already formed on the surface of a substrate W chucked by a substrate chuck C, and there can be pattern-derived concave/convex portions of, for example, about 80 nm to 100 nm. The requirement of planarization according to this embodiment is to planarize the pattern-derived surface concave/convex portions.

Figure 12A:
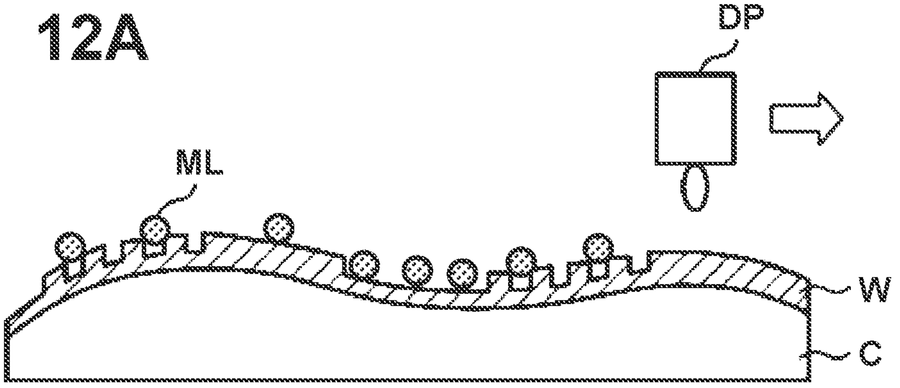
FIGS. 12A to 12D are views for explaining the outline of a planarization process.

In the supply step shown in FIG. 12A, a composition ML as a planarization material is supplied from a dispenser DP to the surface of the substrate W chucked by the substrate chuck C. The dispenser DP is arranged on a bridge (not shown) suspended above a base that also serves as a Z-direction guide of a substrate stage holding the substrate chuck C. By scanning and driving the substrate W chucked by the substrate chuck C once or a plurality of times below the dispenser DP, the composition ML is supplied to the entire surface of the substrate. The dispenser DP can be a jetting module for supplying the composition ML in a state of droplets. The dispenser DP can supply the composition ML while applying the supply amount distribution thereof in accordance with the arrangement of the concave/convex pattern formed on the surface of the substrate W and the like. More specifically, the composition ML can be supplied such that the droplet density is high for a portion where the ratio of the concave portion of the pattern on the substrate surface is high, and the droplet density is low for a portion where the ratio of the concave portion is low. To do this, when the composition ML is supplied by the dispenser DP, substrate alignment measurement can be performed to preliminarily match the position of the pattern formed on the substrate W with the position of the density pattern of the composition ML to be supplied.

Figure 12B:
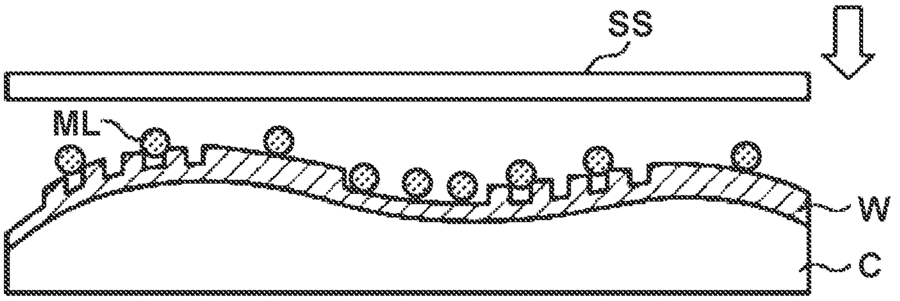

In the contact step shown in FIG. 12B, a superstrate SS (to be also referred to as a "flat template"), which is a member including a flat surface with no pattern formed thereon and has an outer dimeter equal to or larger than that of the substrate W, is brought into contact with the composition ML, and the superstrate SS is pressed against the entire region of the surface of the substrate W. With this, the composition ML spreads in a layer (to be referred to as "filling" or "spreading" hereinafter).

Figure 12C:
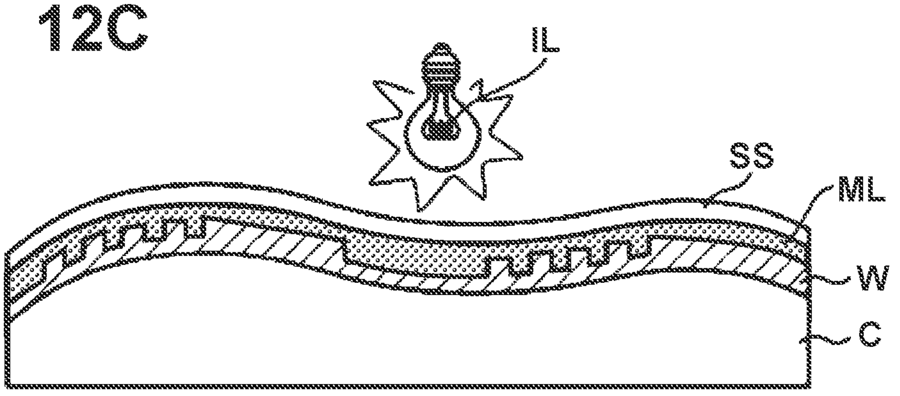

In the curing step shown in FIG. 12C, in a state in which the superstrate SS is in contact with the composition ML on the substrate W, ultraviolet light from a light source IL is applied to the entire region of the surface of the substrate W collectively (or by repeating partial exposure). With this, the composition ML spread in the layer is cured.

Figure 12D:
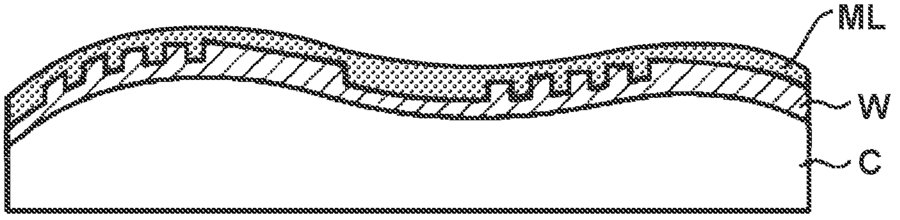

In the separation step shown in FIG. 12D, the superstrate SS is separated from the cured composition ML on the substrate W. Thus, the pattern-derived surface concave/convex portions of the substrate W are planarized. Note that it is not an object here to correct the flatness of a component with a low spatial frequency, such as the profile of the entire substrate distorted with respect to the absolute plane. For such a component, the non-planar component is compensated by the focus tracking control of an exposure apparatus in a subsequent pattern forming step.

In this manner, the planarization process with the imprint technique applied thereto is a technique of supplying a composition in accordance with the steps of a substrate, bringing a thin flat member called a superstrate into contact with the supplied composition, and curing the composition, thereby performing planarization on the order of nanometers. Note that in the planarization process, use of the superstrate is not essential. If a solvent is added to the composition, planarization may be implemented without using a superstrate. Hence, there can be a type of planarization process that does not bring a superstrate into contact with a composition, instead, waits until the composition is planarized as it naturally spreads, and then cures the composition.

Hence, in an example, the film forming apparatus can be a planarization apparatus using the imprint technique. A description will be made below assuming that the film forming apparatus is a planarization apparatus as a detailed example.

FIG. 1 is a schematic view showing the configuration of the film forming apparatus 1 according to this embodiment. In the attached drawings, the Z-axis is provided in the vertical direction, and the X- and Y-axes orthogonal to each other are provided in a plane orthogonal to the Z-axis. Directions parallel to the X-axis, the Y-axis, and the Z-axis will be referred to as the X direction, the Y direction, and the Z direction, respectively, hereinafter.

Referring to FIG. 1, the film forming apparatus 1 can include a composition arranging unit 2, a liquid film forming unit 3, a composition curing unit 4, and a controller 5. A substrate 6 is conveyed to each of the composition arranging unit 2, the liquid film forming unit 3, and the composition curing unit 4 by a conveyance apparatus (not shown). The composition arranging unit 2, the liquid film forming unit 3, and the composition curing unit 4 may be stored in separate chambers, or may be stored in one chamber.

The composition arranging unit 2 includes a substrate stage 7 that holds the substrate 6 (wafer) and moves, and an arranging unit 8 (dispenser) that arranges a composition in a state of droplets on the substrate 6. The arranging unit 8 can arrange a composition 9 containing a solvent and a polymerizable material on the substrate 6 while moving in the X and Y directions. Alternatively, while the substrate stage 7 moves the substrate 6 in the X and Y directions, the arranging unit 8 may arrange the composition 9 on the substrate 6. The composition 9 is thus arranged on the substrate 6.

The composition is a curable composition that is cured by receiving curing energy. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used. The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like. The viscosity (the viscosity at 25° C.) of the curable composition is, for example, 1 mPa·s (inclusive) to 100 mPa·s (inclusive). As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In this embodiment, the composition 9 is a curable composition having a property of being cured by irradiation of light having a specific wavelength. The curable composition contains at least a polymerizable compound that is a nonvolatile component, and a solvent that is a volatile component. The solvent is a solvent for dissolving a polymerizable compound. Examples of the solvent are alcohol based solvents, ketone based solvents, ether based solvents, ester based solvents, nitrogen-containing solvents. In this specification, a cured film means a film of the composition 9 polymerized and cured on a substrate.

The liquid film forming unit 3 includes a substrate stage 10 that holds the substrate 6 and moves, a gas supply port 12 that supplies a gas to a space above the substrate 6 in the liquid film forming unit 3, and a gas discharge port 13 that discharges the gas from the liquid film forming unit 3. Also, the liquid film forming unit 3 includes a gas controller 14 that controls the gas supply port 12 and the gas discharge port 13. In the liquid film forming unit 3, an opening portion 11 is formed above the substrate stage 10. A light source unit 15 configured to illuminate the substrate 6, an imaging unit 16 that observes a liquid film state on the substrate 6, and an optical system 17 are arranged above the opening portion 11. The optical system 17 irradiates the substrate 6 placed on the substrate stage 10 with light from the light source unit 15 and guides reflected light from the substrate 6 to the imaging unit 16. As the light source unit 15, for example, a Light Emitting Diode (LED) or a Vertical Cavity Emitting Laser (VCSEL) can be used. However, another light source device may be used. As the imaging unit 16, for example, a CCD camera or a CMOS camera can be used. However, another imaging device may be used. The light emitted from the light source unit 15 travels to the opening portion 11 via the optical system 17. The light emitted from the light source unit 15 is light having a wavelength that does not cure the composition 9, and the lower portion of the opening portion 11 is sealed by a cover glass 18 that transmits the light. In the liquid film forming unit 3, the liquid film forming state of the composition 9 on the substrate 6 is observed by the imaging unit 16.

The composition curing unit 4 includes a substrate stage 19 that holds the substrate 6 and moves, a mold 21 (a superstrate or a planarization plate) that is brought into contact with a liquid film 20 on the substrate 6, a mold holding unit 22 that holds the mold 21, and an irradiation unit 23 that irradiates the composition 9 with light to cure it. The irradiation unit 23 can include a light source. The light source can be formed by a lamp such as a mercury lamp, but is not limited to a specific light source if it emits light with a wavelength that passes through the mold 21 and cures the composition 9. The mold 21 is made of a material that transmits the light emitted from the irradiation unit 23. The mold holding unit 22 sucks and holds the mold 21. In a state in which the mold 21 (the flat surface of the mold 21) is in contact with the liquid film 20 on the substrate 6, the irradiation unit 23 irradiates the liquid film 20 on the substrate 6 with light, thereby curing the liquid film 20 and forming a cured film (planarized film).

The controller 5 can control the entire film forming apparatus 1. More specifically, the controller 5 controls the conveyance apparatus (not shown), the arranging unit 8, the light source unit 15, the imaging unit 16, the gas controller 14, the mold holding unit 22, the irradiation unit 23, and the substrate stages 7, 10, and 19. The controller 5 also functions as a processing unit that analyzes an image obtained by imaging. The controller 5 can be formed by a general-purpose or dedicated computer with a program installed therein, or a combination of some or all of these.

A chuck (a vacuum chuck or an electrostatic chuck) (not shown) is mounted on each of the substrate stages 7, 10, and 19, and the substrate 6 can be fixed by the chuck.

Figure 2:
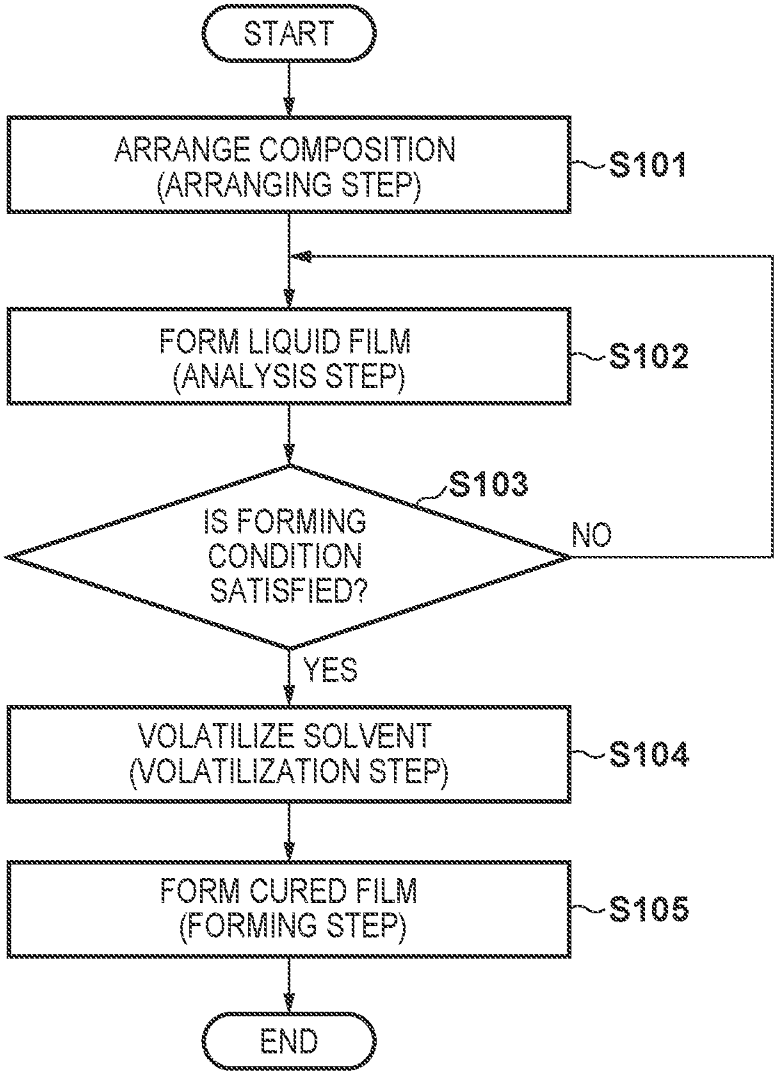
FIG. 2 is a flowchart of a film forming method according to the first embodiment.

A film forming method by the film forming apparatus 1 will be described with reference to a flowchart shown in FIG. 2. Step S101 is an arranging step of arranging the composition 9 on the substrate 6. The substrate 6 loaded into the composition arranging unit 2 by the conveyance apparatus is placed on the substrate stage 7 and fixed by the chuck. The controller 5 controls the arranging unit 8 to discretely arrange the composition 9 on the substrate 6. The substrate 6 with the composition 9 arranged thereon is unloaded from the composition arranging unit 2 by the conveyance apparatus.

Figure 3:
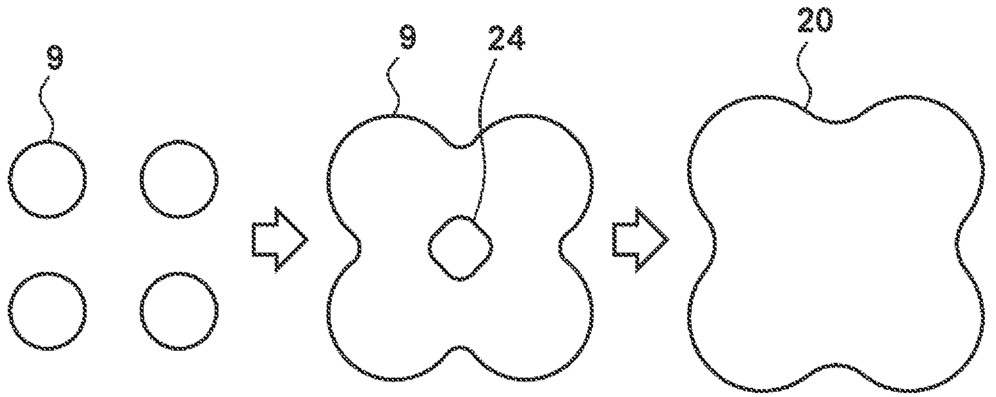
FIG. 3 is a view showing a process of forming a liquid film.

Step S102 is a step of forming a liquid film on the substrate. Step S102 is also an analysis step of analyzing an image obtained by the imaging unit 16 capturing a process in which each of a plurality of droplets of the composition 9 is connected to (merged with) adjacent droplets on the substrate 6, and a continuous liquid film is thus formed on the substrate 6. The substrate 6 with the composition 9 arranged thereon is loaded into the liquid film forming unit 3 by the conveyance apparatus, placed on the substrate stage 10, and fixed by the chuck. The plurality of droplets of the composition 9 discretely arranged on the substrate 6 by the arranging unit 8 begin to spread on the surface of the substrate 6 immediately after these are arranged on the substrate. FIG. 3 is a view showing the spread of plurality of a droplets of the composition 9 on the surface of the substrate 6. First, the plurality of discretely arranged droplets of the composition 9 begin to spread on the substrate 6. Along with the progress of the spread of the plurality of droplets of the composition 9, droplets adjacent to each other are connected. Finally, an inter-composition gap 24 (inter-droplet gap) is filled, and the liquid film 20 is formed. When the inter-composition gap 24 is filled until a step of forming a cured film to be described later, a defect occurrence on the cured film can be suppressed.

On the other hand, volatilization of the solvent contained in the composition 9 starts immediately after the composition 9 is arranged on the substrate 6. For this reason, along with the elapse of time, the viscosity of the composition 9 increases, and the spread speed on the substrate 6 decreases. Hence, in step S102 of forming a liquid film, a process of suppressing volatilization of the solvent may be added. In an example, after the arranging step, the controller 5 controls the gas controller 14 to supply a steam of the solvent from the gas supply port 12 to the space above the substrate 6 such that volatilization of the solvent contained in the composition 9 (liquid film 20) is suppressed (first supply step). This suppresses the volatilization speed of the solvent.

Also, in step S102, the forming state of the liquid film by the composition 9 is observed using the imaging unit 16. The controller 5 performs image analysis for image data obtained by the imaging unit 16. After that, in step S103, the controller 5 determines whether the result of image analysis satisfies a predetermined condition (to be referred to as a "forming condition" hereinafter) representing that the forming state of the liquid film is sufficient, thereby determining whether the liquid film 20 is formed.

Figure 4:
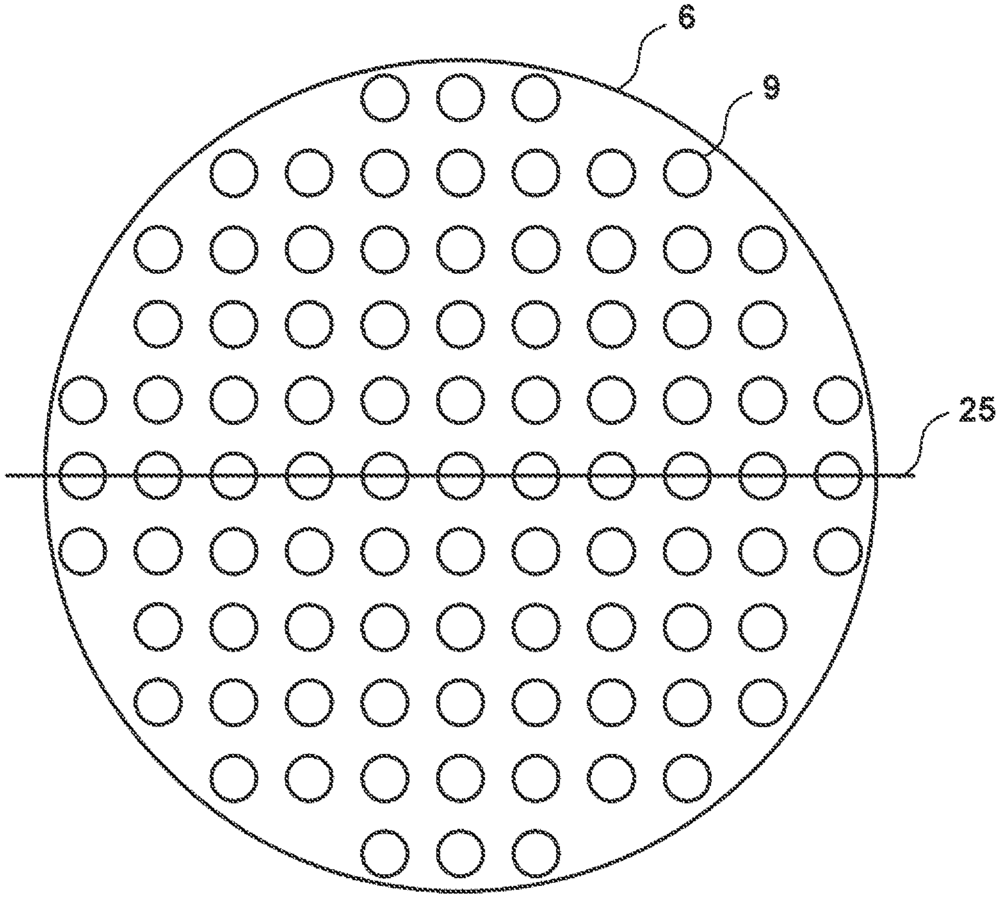
FIG. 4 is a view showing a state in which a composition is arranged on a substrate.
Figure 5:
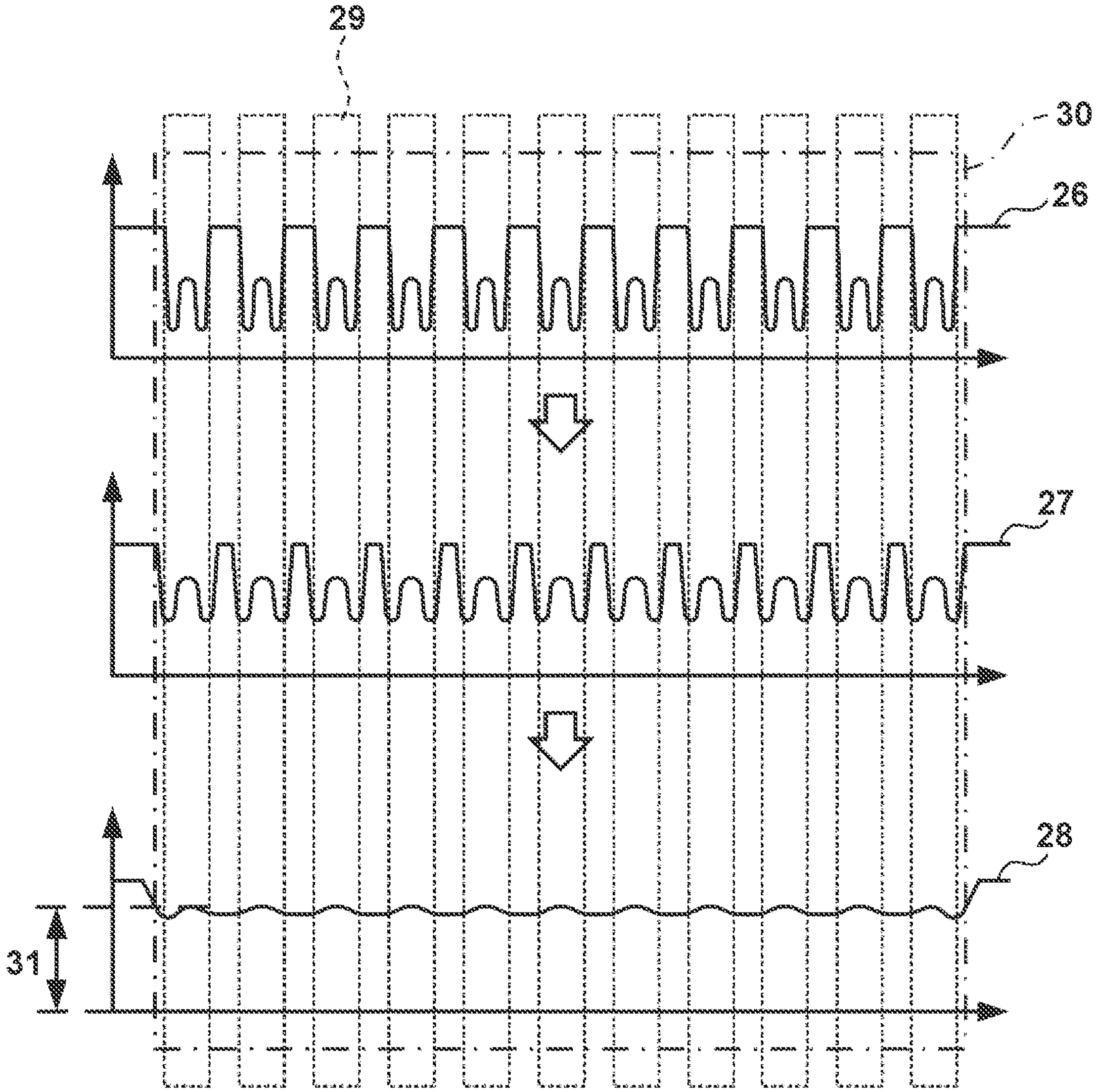
FIG. 5 is a view showing an example of signal intensity distributions in a liquid film forming step.

An example of image analysis in step S102 and determination processing in step S103 will be described with reference to FIGS. 4 and 5. FIG. 4 shows an example of the composition 9 discretely arranged on the substrate 6, and FIG. 5 shows signal intensity distributions 26, 27, and 28 of image data at the position of a line 25 in FIG. 4. Image data obtained by the imaging unit 16 can include signal intensity distributions by the characteristics of the substrate 6, the light source unit the optical system 17, and the imaging unit 16. For this reason, the signal intensity distributions 26, 27, and 28 are obtained by subtracting the signal intensity distribution of the substrate 6 obtained in advance before the arrangement of the composition 9. Measurement of the signal intensity distribution before the arrangement of the composition 9 may be executed using the same substrate 6 or may be executed using another substrate that has undergone similar processes.

At an arrangement position 29 of the composition 9, since the composition 9 absorbs part of light emitted from the light source unit 15, and therefore, the illuminance lowers. On the side surface of the composition 9, since the light reflection amount in the direction of the imaging unit 16 is small, the illuminance further lowers. As the composition 9 spreads on the substrate 6, the surface of the substrate 6 exposed between the discretely arranged droplets of the composition 9 becomes narrow, and the signal intensity distribution 26 changes to the signal intensity distribution 27. Also, if the liquid film 20 is formed by the composition 9, the exposed portion of the surface of the substrate 6 is eliminated, the illuminance of a region where the composition 9 is not arranged lowers, and the signal intensity distribution 27 changes to the signal intensity distribution 28. If a signal intensity 31 in a liquid film forming region 30 falls below a predetermined threshold in the signal intensity distribution 28, the controller 5 can judge that the liquid film 20 is formed at the position of the line 25. In an example, the above-described "forming condition" can be a condition that the signal intensity 31 obtained from the image data obtained by the imaging unit 16 falls below the predetermined threshold in all liquid film forming regions 30 on the substrate 6. If the analysis result satisfies the forming condition, that is, if the signal intensity 31 falls below the predetermined threshold in all liquid film forming regions 30 on the substrate 6, the controller 5 judges that the liquid film 20 is formed on the substrate 6, and the process advances to step S104. Note that an example of treatment in a case where the analysis result does not satisfy the forming condition will be described from in the fourth and subsequent embodiments.

Step S104 is a volatilization step of volatilizing the solvent contained in the liquid film 20 by enhancing the solvent volatilization effect as compared to the process of forming the composition 9 (liquid film 20) in step S102. The volatilization step may be understood as a wait step of waiting for a predetermined time to volatilize the solvent contained in the liquid film 20. During waiting, environment adjustment for enhancing the solvent volatilization effect is performed as compared to the process of forming the composition 9 (liquid film 20) in step S102. In an example, before the start of the volatilization step, the controller 5 stops supply of the steam of the solvent from the gas supply port 12, which is performed as the first supply step. That is, the volatilization suppressing process for the solvent contained in the liquid film 20 is stopped. Thus, in the volatilization step S104, the volatilization effect of the solvent contained in the liquid film 20 is enhanced as compared to the process of forming the liquid film 20. To further enhance the solvent volatilization effect during the period of the volatilization step, the controller 5 may control the gas controller 14 to supply Clean Dry Air (CDA) from the gas supply port 12 to the space above the substrate (second supply step). At this time, the gas in the liquid film forming unit 3 may be exhausted from the exhaust port 13. As another method, pressure reduction and baking may be performed in the liquid film forming unit 3. After that, the substrate 6 is loaded from the liquid film forming unit 3 by the conveyance apparatus. Note that the gas to be supplied to the space above the substrate is not limited to CDA. For example, a gas selected from the group consisting of CDA, oxygen, nitrogen, helium, and the like may be supplied. By the supply of the gas, filling of the composition to unconnected portions is promoted.

Step S105 is a forming step of forming a cured film by curing the liquid film 20 formed on the substrate 6. The substrate 6 with the liquid film 20 formed on its surface by the liquid film forming unit 3 is loaded into the composition curing unit 4 by the conveyance apparatus, placed on the substrate stage 19, and fixed by the chuck. The controller 5 drives at least one of the mold holding unit 22 and the substrate stage 19, thereby bringing the liquid film 20 on the substrate 6 into contact with (the flat surface of) the mold 21. In a state in which the liquid film 20 and the mold 21 are in contact, the controller 5 causes the irradiation unit 23 to irradiate the composition 9 with light to cure it. A cured film (solid layer) is thus formed on the substrate 6. After the cured film (solid layer) is formed, the controller 5 drives at least one of the mold holding unit 22 and the substrate stage 19, thereby separating the cured film from the mold 21. Note that if the composition curing unit 4 is of a type that performs planarization without using the mold 21, the controller 5 waits until the composition 9 naturally spreads to be planarized. After that, the controller 5 causes the irradiation unit 23 to irradiate the composition 9 with light to cure it.

As described above, in the film forming apparatus 1 according to this embodiment, the liquid film forming state on the substrate 6 is detected by the imaging unit 16 in the step of forming the liquid film, and the process advances to the volatilization step at an appropriate timing according to the detected liquid film forming state. According to this embodiment, since the process can advance to the volatilization step at the timing when formation of the liquid film has been confirmed, there is an advantage in terms of throughput as compared to a conventional art in which the process advances to the volatilization step after waiting for a predetermined time independently of the liquid film forming state. Note that volatilization of the solvent contained in the composition 9 starts immediately after the composition 9 is arranged on the substrate 6. If the volatilization is known to be completed within the period of step S102, the volatilization step as step S104 need not be provided. In this case, the process may advance not to the waiting step but to the forming step in response to the image analysis result satisfying the forming condition. According to the above-described embodiment, a film forming method advantageous in concurrently suppressing defects and improving throughput is provided.

Second Embodiment

In the second embodiment, in step S102, a controller 5 performs frequency analysis of image data obtained by an imaging unit 16. In step S103, if a frequency component by the arrangement of the composition 9 falls below a threshold defined in advance, the controller 5 judges that a liquid film 20 is formed.

Figure 6:
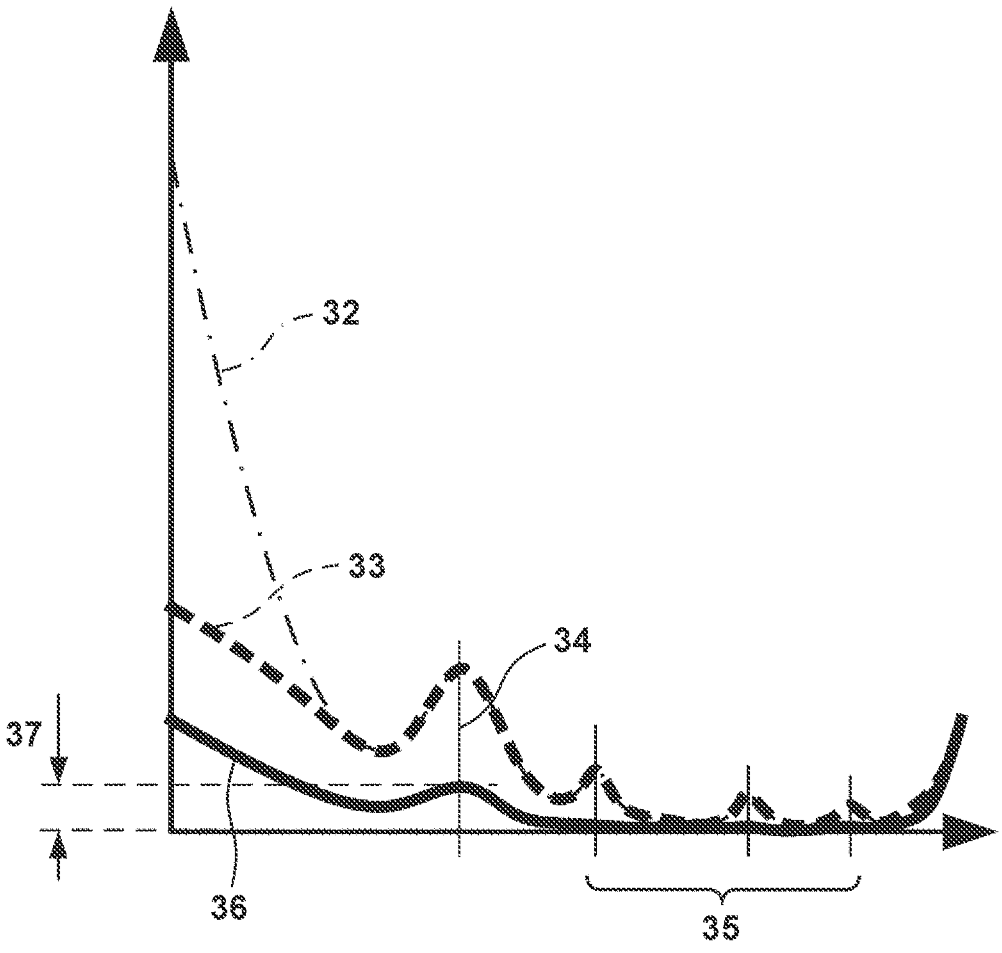
FIG. 6 is a view showing an example of frequency analysis results of the signal intensity distributions.

If the illuminance distribution at the position of a line 25 of the composition 9 discretely arranged on a substrate 6 is frequency-analyzed, an analysis result 32 shown in FIG. 6 is obtained. FIG. 6 is a semi-log graph in which the frequency is plotted along the abscissa, the illuminance is plotted along the ordinate, and the frequency on the abscissa is expressed as a logarithm. The analysis result 32 includes the component of the discretely arranged composition 9 and components by the characteristics of the substrate 6, a light source unit 15, an optical system 17, and the imaging unit 16. Of the analysis result 32, the component of the discretely arranged composition 9 is shown as a curve 33. In this embodiment, a frequency component 34 is a frequency component by the arrangement of the composition 9, and a frequency component 35 is a harmonic component by the arrangement of the composition 9. As the composition 9 spreads along with the elapse of time, the curve 32 changes to a curve 36 on which the frequency component 34 by the arrangement of the composition 9 is small. If an illuminance 37 of the frequency component 34 in FIG. 6 falls below a predetermined threshold, the controller 5 can judge that the liquid film 20 is formed at the position of the line 25. Hence, in this embodiment, the "forming condition" can be a condition that the illuminance 37 of the frequency component 34 obtained from the result of frequency analysis of the image data obtained by the imaging unit 16 falls below the predetermined threshold in all liquid film forming regions 30 on the substrate 6. If the analysis result satisfies the forming condition in step S103, that is, if the illuminance 37 of the frequency component 34 obtained from the result of frequency analysis of the image data falls below the threshold in all liquid film forming regions 30 on the substrate 6, the controller 5 judges that the liquid film 20 is formed.

Third Embodiment

Figure 7:
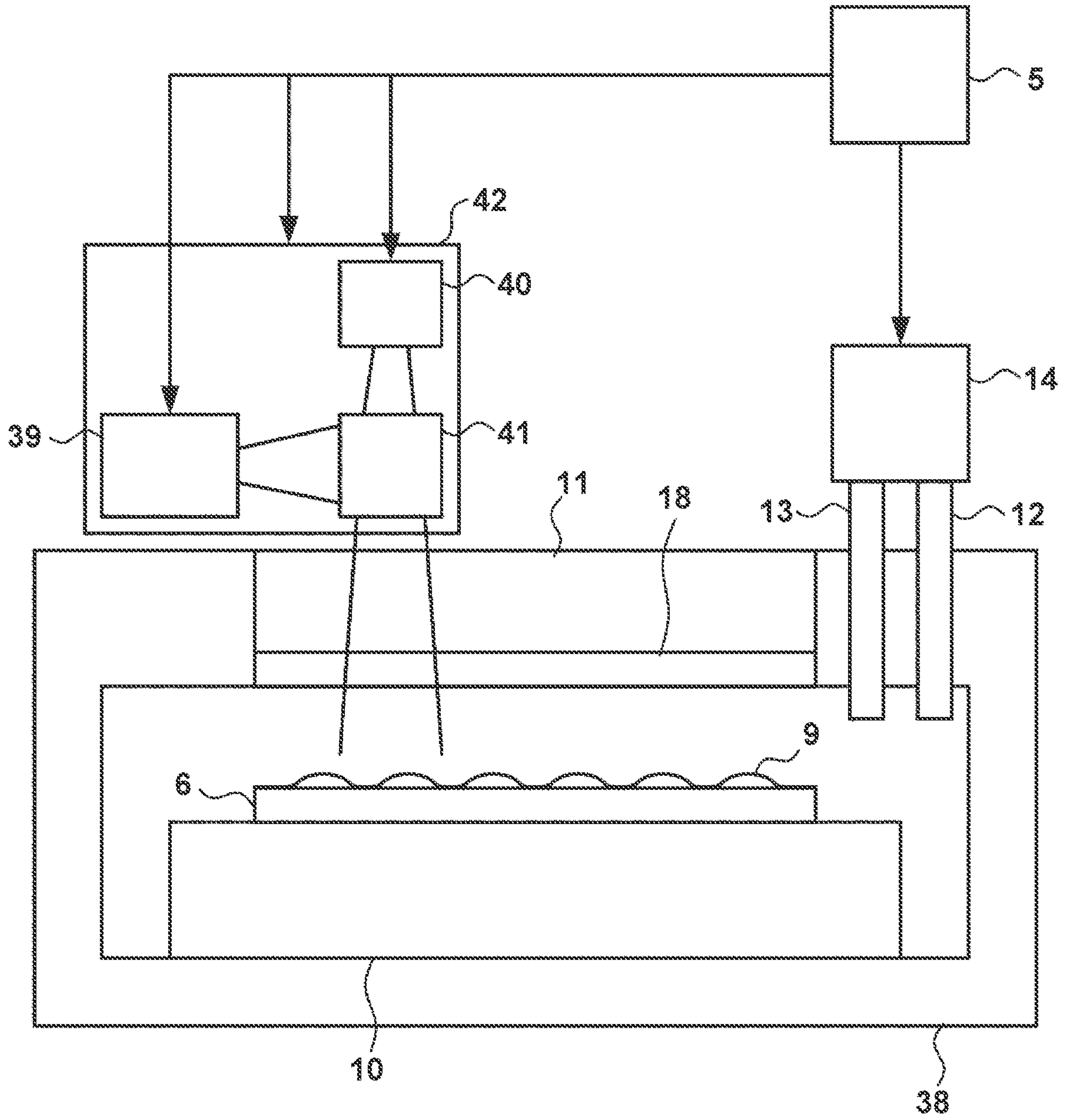
FIG. 7 is a view showing the configuration of a liquid film forming unit according to the third embodiment.

A film forming apparatus according to the third embodiment will be described next with reference to FIG. 7. FIG. 7 is a view showing the configuration of a liquid film forming unit in the film forming apparatus according to the third embodiment. The configurations of a composition arranging unit 2, a composition curing unit 4, and the like are the same as in the first embodiment (FIG. 1).

A liquid film forming unit 38 shown in FIG. 7 includes, above an opening portion 11, an illumination unit 39 that illuminates a part of a substrate 6, and an imaging unit 40 that observes the liquid film forming state in a region of the substrate 6 illuminated by the illumination unit 39. Also, the liquid film forming unit 38 can include an optical system 41 that irradiates the substrate 6 with the light emitted from the illumination unit 39 and guides reflected light from (a composition 9 on) the substrate 6 to the imaging unit 40. The liquid film forming unit 38 can also include a driving unit 42. The driving unit 42 includes the illumination unit 39, the imaging unit 40, and the optical system 41 and is driven in a direction parallel to the surface of the substrate 6. The driving unit 42 can be driven in a range where the imaging unit 40 can observe the whole region of the substrate 6. A controller 5 can control the drive of the driving unit 42 in addition to the units described in the first embodiment.

A film forming method according to this embodiment will be described next. Steps other than step S102 shown in FIG. 2 are the same as in the first embodiment.

In step S102 of this embodiment, after the substrate 6 is loaded into the liquid film forming unit 38, the imaging unit 40 captures the composition 9 in a region narrower than the substrate 6. Hence, the liquid film forming state can be observed at a higher resolution. The controller 5 also drives the driving unit 42 and causes the imaging unit 40 to do observation while relatively scanning the imaging unit 40 and the substrate 6. Also, the controller 5 can shorten the scanning drive time by driving the driving unit 42 such that a region where liquid film formation is slow on the substrate 6 is selectively observed.

The thus obtained image data can be used to judge the forming state of a liquid film 20 by the same processes as in the first embodiment.

Fourth Embodiment

Figure 9:
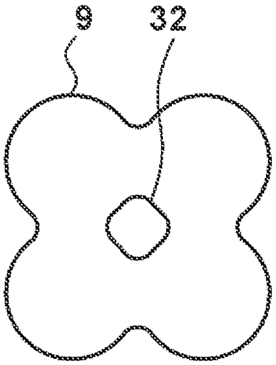
FIG. 9 is a view showing a state in which an unconnected portion of a composition is generated.

Sometimes, due to the viscosity factor of a composition 9, or the like, an inter-composition gap 24 (FIG. 3) is not filled even after a predetermined time or more, and a liquid film 20 is not normally formed. FIG. 9 shows a state in which an unconnected portion 32 of the composition 9 is generated. In the fourth embodiment, a recovery process in a case where a predetermined time elapses without the above-described forming condition being satisfied by the image analysis result in step S103 will be described.

Figure 8:
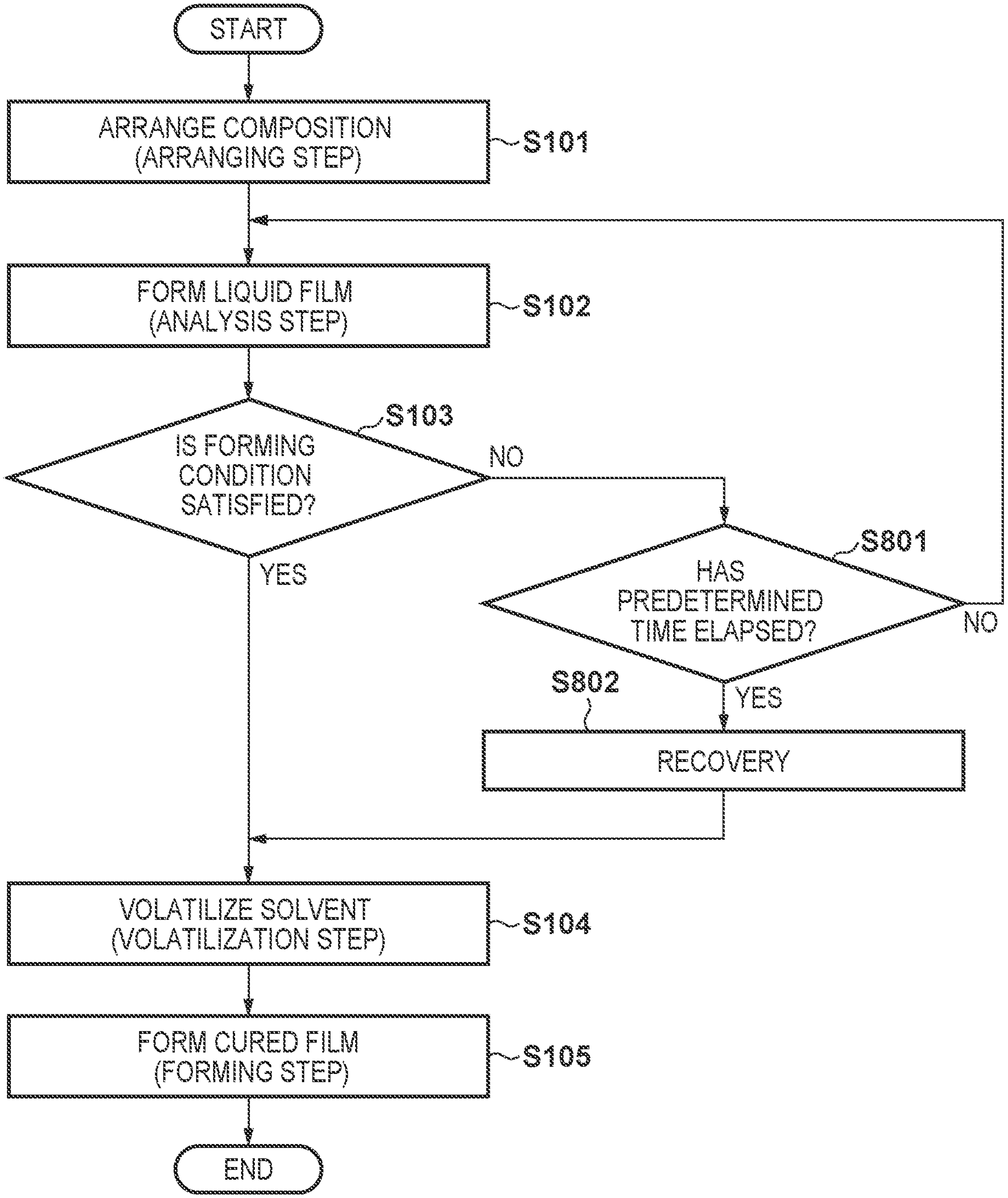
FIG. 8 is a flowchart of a film forming method according to the fourth embodiment.

FIG. 8 is a flowchart of a film forming method according to this embodiment. This flowchart is a modification of the flowchart of FIG. 2 described in the first embodiment, and steps S801 and S802 are added to the flowchart of FIG. 2.

If the result of image analysis does not satisfy the forming condition in step S103, that is, if a signal intensity 31 does not fall below a predetermined threshold in one of liquid film forming regions 30 on a substrate 6, it is judged that the liquid film 20 is not sufficiently formed on the substrate 6, and the process advances to step S801. In step S801, a controller 5 determines whether a predetermined time has elapsed from the start of step S102. If the predetermined time has not elapsed yet, the process returns to step S102 to continue the analysis step. On the other hand, if the predetermined time has elapsed, it is judged that the liquid film 20 will not be sufficiently formed (the unconnected portion will not be eliminated) even if waiting longer, and the process advances to step S802.

Figure 10:
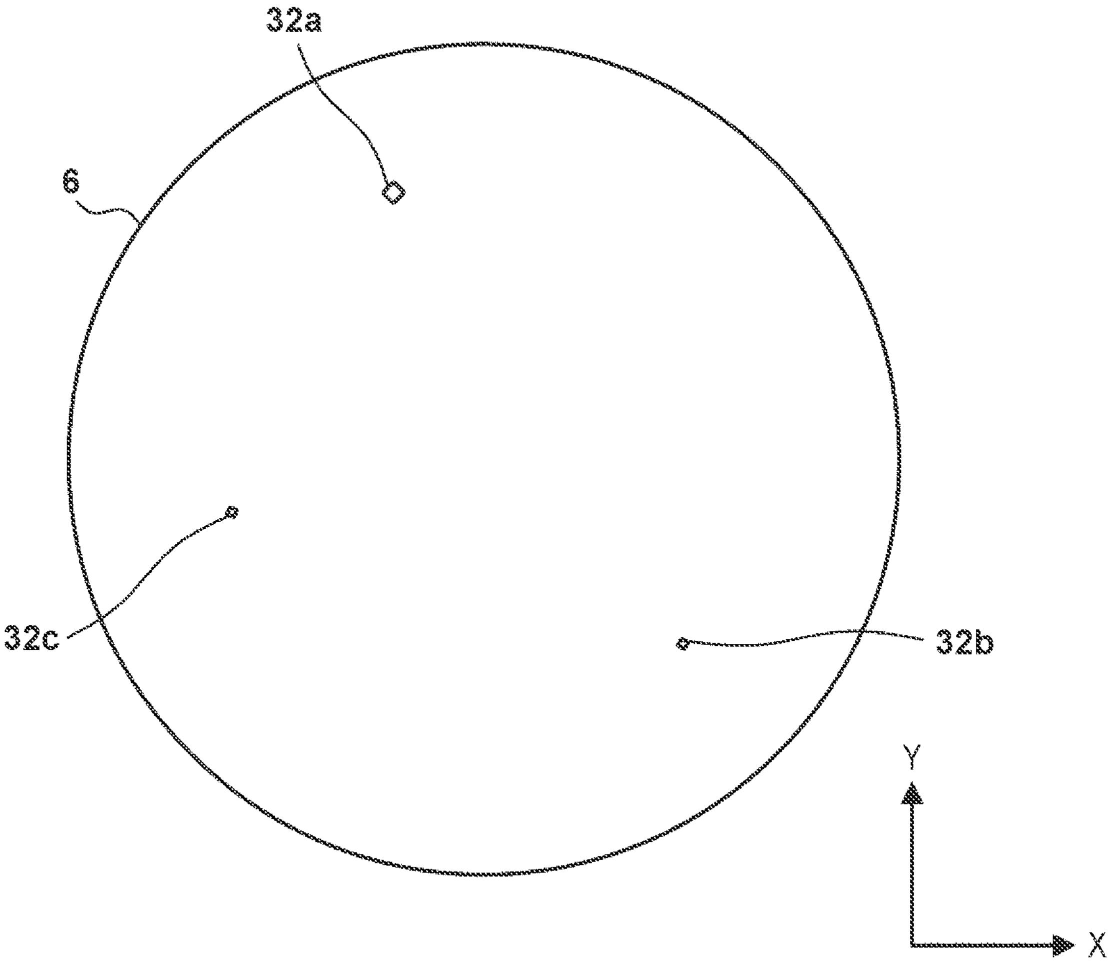
FIG. 10 is a view showing an example of detected unconnected portions.

Step S802 is a recovery step of detecting an unconnected portion that is a portion where connection of adjacent droplets is insufficient in the formed film and performing a recovery process for the detected unconnected portion. In an example, in recovery step S802, the controller 5 measures the position coordinates (X, Y) of an unconnected portion 32 of the composition 9 based on the image data obtained by an imaging unit 16. FIG. 10 shows an example that three unconnected portions 32*a*, 32*b*, and 32*c* are detected from image data. The position coordinates of the unconnected portions 32*a*, 32*b*, and 32*c* on the substrate 6 are defined as (X1, Y1), (X2, Y2), and (X3, Y3), respectively.

The controller 5 controls the conveyance apparatus to unload the substrate 6 from a liquid film forming unit 3 and load it into a composition arranging unit 2. The substrate 6 is placed on a substrate stage 7 and fixed by a chuck. The controller 5 controls an arranging unit 8 to arrange the composition 9 on each of the unconnected portions 32*a*, 32*b*, and 32*c*. For example, the arranging unit 8 is sequentially moved to positions corresponding to (X1, Y1), (X2, Y2), and (X3, Y3) on the substrate 6 to arrange the composition 9. Alternatively, the substrate stage 7 with the substrate 6 held thereon may be moved to below the arranging unit 8 to arrange the composition 9.

Also, in accordance with the size of each of the unconnected portions 32*a*, 32*b*, and 32*c*, the controller 5 may adjust the amount of the composition 9 to be arranged. The amount of the composition 9 can be obtained in advance in accordance with the area of each of the unconnected portions 32*a*, 32*b*, and 32*c*.

After that, the controller 5 controls the conveyance apparatus to unload the substrate 6 from the composition arranging unit 2 and load it into the liquid film forming unit 3. The substrate 6 is placed on a substrate stage 10 and fixed by a chuck. The composition 9 arranged on the unconnected portions 32*a*, 32*b*, and 32*c* by the arranging unit 8 begins to spread on the surface of the substrate 6.

By the recovery process, the composition 9 spreads to the unconnected portions 32*a*, 32*b*, and 32*c*, and the liquid film 20 is generated. After the recovery process is completed, the process advances to volatilization step S104.

Fifth Embodiment

In the fourth embodiment, the substrate 6 is moved from the liquid film forming unit 3 to the composition arranging unit 2, and the composition 9 is arranged on each of the unconnected portions 32*a*, 32*b*, and 32*c* in the composition arranging unit 2. On the other hand, in the fifth embodiment, a recovery process is performed in a liquid film forming unit 3 without moving a substrate 6 from the liquid film forming unit 3 to a composition arranging unit 2. In this embodiment, a controller 5 drives a substrate stage 10 such that an unconnected portion 32*a* is arranged at the supply destination of a gas supply port 12. After that, the controller 5 controls a gas controller 14 to supply a solvent from the gas supply port 12. This is similarly executed sequentially for unconnected portions 32*b* and 32*c* as well.

Note that in this embodiment, instead of supplying a solvent to the unconnected portion, CDA may be supplied. The gas to be supplied is not limited to CDA, and a gas such as oxygen, nitrogen, or helium may be supplied. By the supply of the gas, filling of the composition to unconnected portions is promoted.

According to this embodiment, at least since the substrate 6 need not be moved from the liquid film forming unit 3 to the composition arranging unit 2, unlike the fourth embodiment, there is an advantage in terms of throughput.

Sixth Embodiment

The recovery process according to the fourth and fifth embodiments is to supply a solvent or a gas to an unconnected portion. Another recovery process is also possible.

For example, another example of the recovery process can apply a vibration of a substrate stage 10 (that is, a substrate 6). For example, a frequency effective for spreading a composition 9 is obtained in advance, and a vibration of the frequency is applied to the substrate stage 10. By this vibration, filling of the composition to unconnected portions is promoted.

Seventh Embodiment

In the fourth embodiment (FIG. 8), the recovery process is performed after liquid film forming step S102. However, the timing of performing the recovery process is not limited to this. The recovery process can be executed at an arbitrary timing before the start of step S105 of forming a cured film. For example, during execution of analysis step S102 (that is, liquid film forming step), the change amount of droplet merge within a predetermined time may be detected, occurrence of an unconnected portion may be predicted based on the change amount, and the recovery process may be executed in accordance with the prediction. Alternatively, the recovery process may be executed after execution of volatilization step S104.

Eighth Embodiment

In the fourth to seventh embodiments, the recovery process performed in a case where a predetermined time elapses without the image analysis result satisfying a predetermined forming condition in step S103 has been described. In the eighth embodiment, as treatment in a case where a predetermined time elapses without the image analysis result satisfying the predetermined forming condition in step S103, a process of unloading a substrate will be described.

Figure 11:
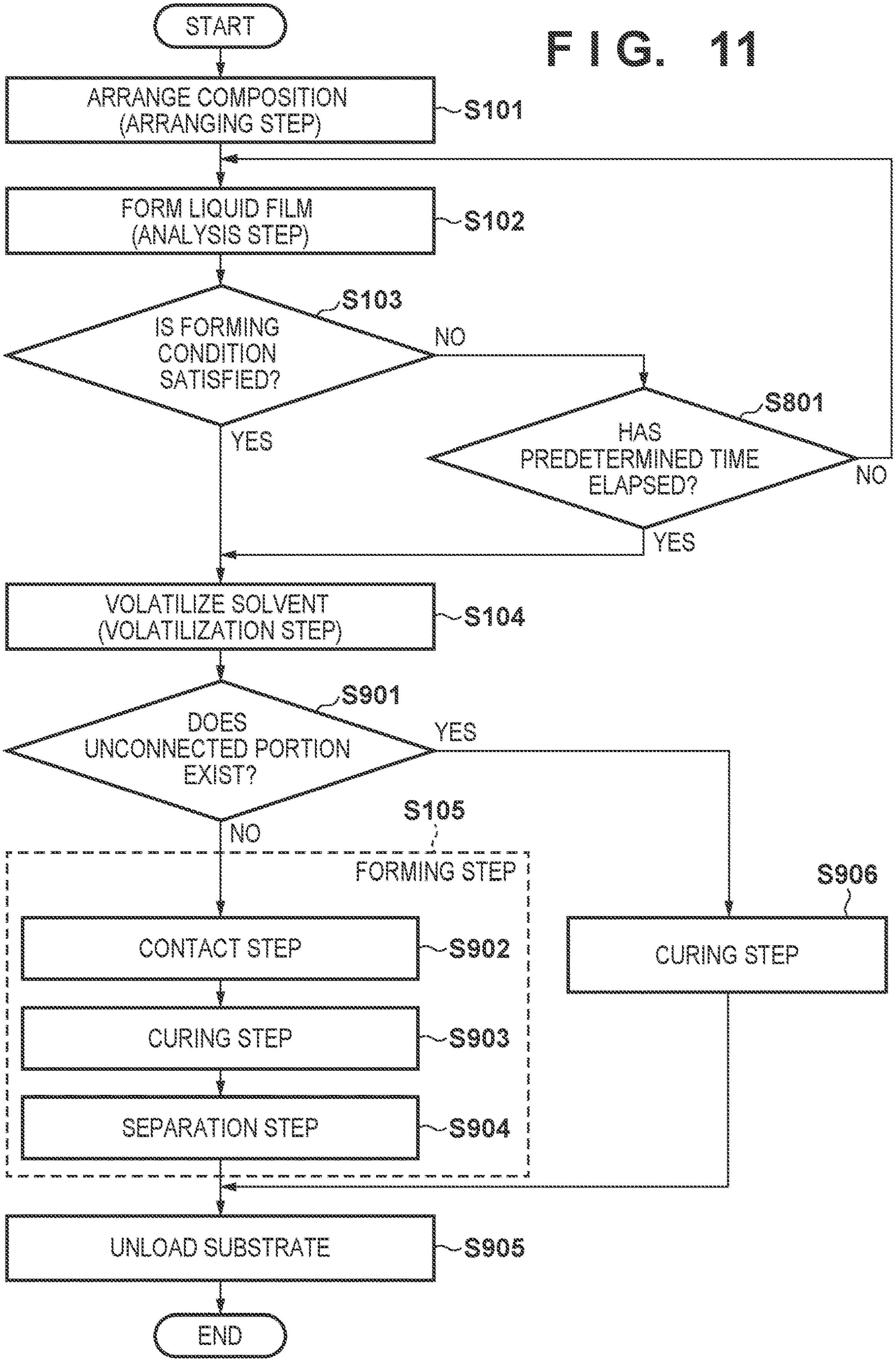
FIG. 11 is a flowchart of a film forming method according to the eighth embodiment.

FIG. 11 shows a flowchart of a film forming method according to this embodiment. This flowchart is a modification of the flowchart of FIG. 8 described in the fourth embodiment. A film forming apparatus 1 according to this embodiment is assumed to be of a type using a mold 21, that is, a type of curing a composition 9 in a state in which a liquid film 20 and the mold 21 are in contact.

In this embodiment, if it is determined in step S801 that a predetermined time has elapsed after the start of step S102, it is judged that a liquid film 20 will not be sufficiently formed (an unconnected portion will not be eliminated) even if waiting longer, and the process advances to step S104. In step S104, a volatilization step is executed. After the end of the volatilization step, a substrate 6 is transferred from a liquid film forming unit 3 to a composition curing unit 4 by a conveyance apparatus.

The process advances to step S901. In step S901, it is determined whether am unconnected portion exists. More specifically, if it is determined in step S103 that an image analysis result satisfies a forming condition, there is no unconnected portion. On the other hand, if the process advances to step S901 via step S801 because the image analysis result does not satisfy the forming condition in step S103, there is an unconnected portion.

If there is no unconnected portion, forming step S105 is executed. In this embodiment, forming step S105 can include contact step S902, curing step S903, and separation step S904. In contact step S902, a controller 5 drives at least one of a mold holding unit 22 and a substrate stage 19, thereby bringing the liquid film 20 on the substrate 6 into contact with (the flat portion of) the mold 21. In curing step S903, in a state in which the liquid film 20 and the mold 21 are in contact, the controller 5 causes an irradiation unit 23 to perform light irradiation to cure the liquid film 20. A cured film (solid layer) is thus formed on the substrate 6. In separation step S904, the controller 5 drives at least one of the mold holding unit 22 and the substrate stage 19, thereby separating the cured film from the mold 21. After that, in unloading step S905, the controller 5 controls the conveyance apparatus to unload the substrate 6 from the composition curing unit 4.

If there is an unconnected portion (YES in step S901), the process advances to step S906. In step S906, the controller 5 causes the irradiation unit 23 to perform light irradiation to cure the liquid film 20, as in step S903. After that, in unloading step S905, the controller 5 controls the conveyance apparatus to unload the substrate 6 from the composition curing unit 4. Thus, as for the substrate with an unconnected portion, the liquid film 20 is cured without bringing the liquid film 20 and the mold 21 into contact, and the substrate is then loaded from the apparatus. Since the liquid film 20 is cured before the substrate is loaded, the substrate is never loaded in a state in which the solvent volatilizes from the liquid film 20, and safety is ensured.

The controller 5 stores execution information representing that contact step S902 has been executed for the substrate 6. By the execution information, it is possible to discriminate execution/unexecution of the contact step for each substrate. The execution information can be transmitted online from the controller 5 to a host system.

In the above-described example, the presence/absence of an unconnected portion is determined by the processes of steps S102, S103, and S801. The timing of unconnected portion determination processing is not limited to this, and can be an arbitrary timing before completion of contact step S902. For example, a detection unit may be provided in the composition curing unit 4, and detection of an unconnected portion may be executed concurrently with contact step S902.

A method of manufacturing an article (a semiconductor IC element, a liquid crystal display element, a color filter, a MEMS, or the like) by using the above-described planarization apparatus will be described next. The manufacturing method includes, by using the above-described film forming apparatus as a planarization apparatus, a step of planarizing a composition by bringing the composition arranged on a substrate (a wafer, a glass substrate, or the like) and a mold into contact with each other, a step of curing the composition, and a step of separating the composition and the mold from each other. With this, a planarized film is formed on the substrate. Then, processing such as pattern formation using a lithography apparatus is performed on the substrate with the planarized film formed thereon, and the processed substrate is processed in other known processing steps to manufacture an article. Other known steps include etching, resist removal, dicing, bonding, packaging, and the like. This manufacturing method can manufacture an article with higher quality than conventional methods.

It is also possible to apply the film forming apparatus described above to an imprint apparatus. The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as at least some of the constituent members of the above-described articles or used temporarily as a resist mask. After etching or ion implantation is performed in the substrate processing step, the resist mask is removed.

A method of manufacturing an article will be described next. As shown step SA of FIG. 13, a substrate 1*z* such as a silicon wafer with a processed material 2*z* such as an insulator formed on the surface is prepared. Next, an imprint material 3*z* is applied to the surface of the processed material 2*z* by an inkjet method or the like. A state in which the imprint material 3*z* is applied as a plurality of droplets onto the substrate is shown here.

Figure 13:
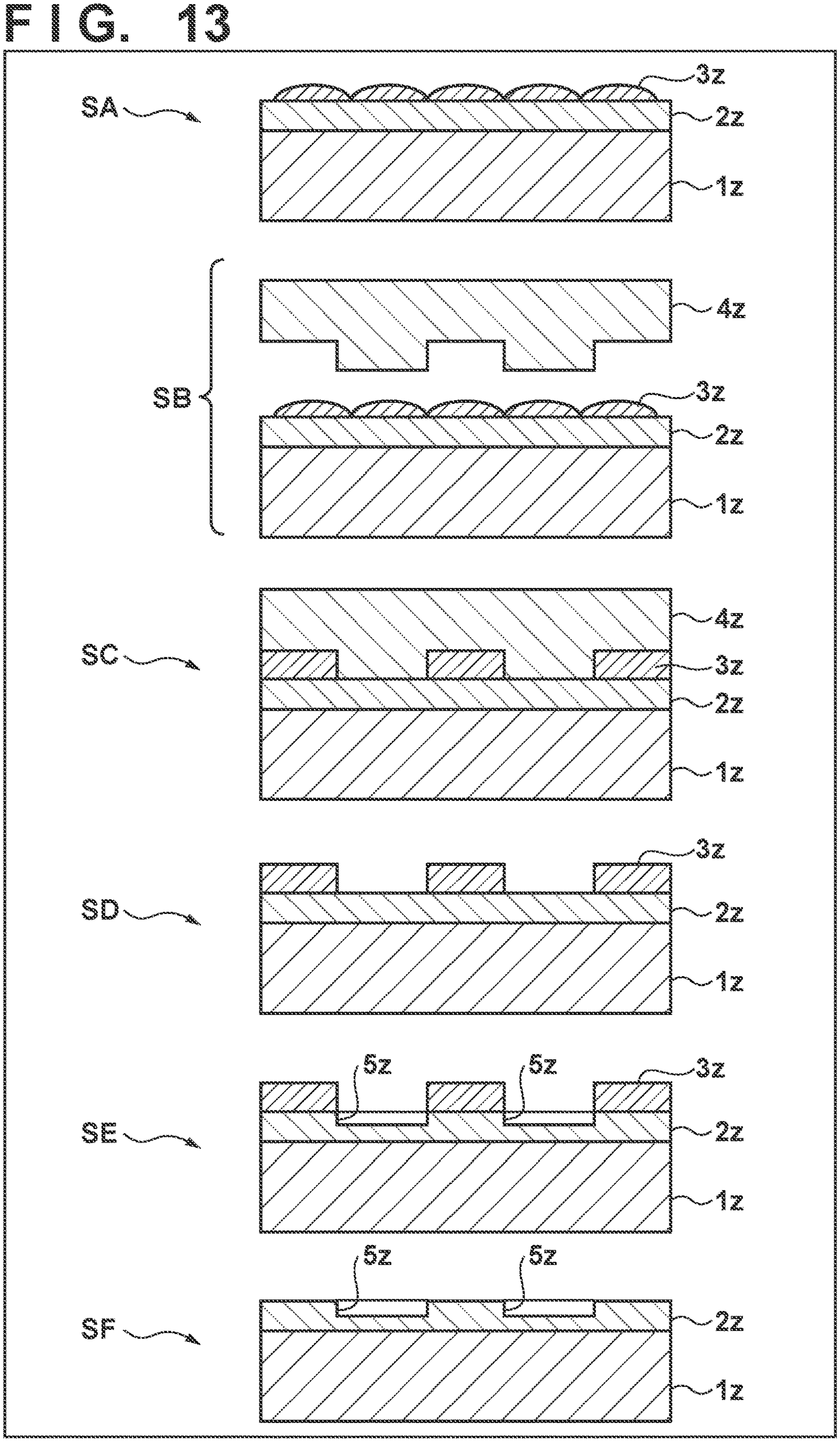
FIG. 13 is a view for explaining an article manufacturing method.

As shown in step SB of FIG. 13, a side of a mold 4*z* for imprint with an uneven pattern is directed toward and made to face the imprint material 3*z* on the substrate. As shown in step SC of FIG. 13, the substrate 1*z* to which the imprint material 3*z* is applied is brought into contact with the mold 4*z*, and a pressure is applied. The gap between the mold 4*z* and the processed material 2*z* is filled with the imprint material 3*z*. In this state, when the imprint material 3*z* is irradiated with energy for curing via the mold 4*z*, the imprint material 3*z* is cured.

As shown in step SD of FIG. 13, after the imprint material 3*z* is cured, the mold 4*z* is separated from the substrate 1*z*. Then, the pattern of the cured product of the imprint material 3*z* is formed on the substrate 1*z*. In the pattern of the cured product, the concave portion of the mold corresponds to the convex portion of the cured product, and the convex portion of the mold corresponds to the concave portion of the cured product. That is, the uneven pattern of the mold 4*z* is transferred to the imprint material 3*z*.

As shown in step SE of FIG. 13, when etching is performed using the pattern of the cured product as an etching resistant mask, a portion of the surface of the processed material 2*z* where the cured product does not exist or remains thin is removed to form a groove 5*z*. As shown in step SF of FIG. 13, when the pattern of the cured product is removed, an article with the grooves 5*z* formed in the surface of the processed material 2*z* can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-093095, filed Jun. 8, 2022, which is hereby incorporated by reference herein in its entirety.

What is claimed is:

1. A film forming method comprising:

discretely arranging, on a substrate, a plurality of droplets of a curable composition containing a polymerizable compound that is a nonvolatile component and a solvent that is a volatile component;

after the arranging, analyzing an image obtained by capturing a process in which each of the plurality of droplets is connected to an adjacent droplet on the substrate, thereby forming a continuous liquid film on the substrate;

volatilizing the solvent contained in the liquid film by enhancing a solvent volatilization effect as compared to the process of forming the liquid film; and forming a cured film by curing the liquid film, wherein after it is determined that an analysis result obtained in the analyzing satisfies a predetermined condition representing that a forming state of the liquid film is sufficient, a process advances to the volatilizing and then advances to the forming, wherein the predetermined condition is a condition that a signal intensity of the image falls below a predetermined threshold in all liquid film forming regions on the substrate, and wherein the signal intensity of the image is a signal intensity obtained by subtracting a signal intensity of an image obtained by capturing the substrate before the plurality of droplets are arranged in the arranging from a signal intensity of an image obtained by capturing the substrate after the plurality of droplets are arranged in the arranging.

2. The method according to claim 1, wherein if the analysis result obtained in the analyzing does not satisfy the predetermined condition, the process does not advance to the volatilizing and returns to the analyzing.

3. The method according to claim 2, further comprising if the analysis result does not satisfy the predetermined condition within a predetermined time after the arranging, detecting an unconnected portion that is a portion where connection of adjacent droplets is insufficient in the formed film, and performing a recovery process for the detected unconnected portion.

4. The method according to claim 3, wherein the recovery process includes arranging the curable composition on the unconnected portion.

5. The method according to claim 3, wherein the recovery process includes supplying the solvent to the unconnected portion.

6. The method according to claim 3, wherein the recovery process includes supplying a gas selected from the group consisting of clean dry air, oxygen, nitrogen, and helium to the unconnected portion.

7. The method according to claim 3, wherein the recovery process includes applying a vibration of a predetermined frequency to the substrate.

8. The method according to claim 3, wherein after the performing the recovery process, the process advances to the forming.

9. The method according to claim 1, further comprising supplying a steam of the solvent to a space above the substrate after the arranging, wherein the supply of the steam is stopped before the volatilizing, thereby enhancing the volatilization effect.

10. The method according to claim 9, further comprising supplying a gas selected from the group consisting of clean dry air, oxygen, nitrogen, and helium to the space above the substrate during a period of the volatilizing.

11. The method according to claim 1, wherein the image is an image captured by an imaging unit while relatively scanning the imaging unit and the substrate.

12. The method according to claim 1, wherein the forming includes:

bringing the liquid film into contact with a flat surface of a mold;

after the bringing, curing the liquid film in a state in which the liquid film and the flat surface of the mold are in contact, thereby forming a cured film; and after the curing, separating the cured film from the mold, and the method further comprises if the analysis result does not satisfy the predetermined condition within a predetermined time after the arranging, curing the liquid film without executing the bringing and then unloading the substrate.

13. An article manufacturing method comprising:

forming a film of a curable composition on a substrate using a film forming method defined in claim 1;

processing the substrate with the film formed thereon in the forming; and manufacturing an article from the processed substrate.

14. A film forming method comprising:

discretely arranging, on a substrate, a plurality of droplets of a curable composition containing a polymerizable compound that is a nonvolatile component and a solvent that is a volatile component;

after the arranging, analyzing an image obtained by capturing a process in which each of the plurality of droplets is connected to an adjacent droplet on the substrate, thereby forming a continuous liquid film on the substrate;

volatilizing the solvent contained in the liquid film by enhancing a solvent volatilization effect as compared to the process of forming the liquid film; and forming a cured film by curing the liquid film, wherein after it is determined that an analysis result obtained in the analyzing satisfies a predetermined condition representing that a forming state of the liquid film is sufficient, a process advances to the volatilizing and then advances to the forming, and wherein the analyzing includes performing frequency analysis of the image, and the predetermined condition is a condition that an illuminance of a frequency component obtained from a result of the frequency analysis falls below a predetermined threshold in all liquid film forming regions on the substrate.

15. An article manufacturing method comprising:

forming a film of a curable composition on a substrate using the film forming method of claim 14;

processing the substrate with the film formed thereon in the forming; and manufacturing an article from the processed substrate.

* * * * *